United States Patent
Chen

(10) Patent No.: US 8,536,559 B2
(45) Date of Patent: Sep. 17, 2013

(54) PHASE CHANGE MEMORY

(75) Inventor: Shih-Hung Chen, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 231 days.

(21) Appl. No.: 12/498,575

(22) Filed: Jul. 7, 2009

(65) Prior Publication Data

US 2011/0006279 A1    Jan. 13, 2011

(51) Int. Cl.
*H01L 29/06* (2006.01)

(52) U.S. Cl.
USPC ........................ 257/5; 257/E45.002

(58) Field of Classification Search
USPC .......... 257/4, 5, 379, 910, E45.002, E27.104, 257/E29.33, 1, 2, 3
See application file for complete search history.

(56) References Cited

U.S. PATENT DOCUMENTS

| | | | |
|---|---|---|---|
| 2004/0051094 A1* | 3/2004 | Ooishi | 257/5 |
| 2004/0165422 A1* | 8/2004 | Hideki et al. | 365/163 |
| 2007/0126040 A1* | 6/2007 | Lung | 257/295 |
| 2008/0002457 A1* | 1/2008 | Toda et al. | 365/148 |
| 2010/0320435 A1* | 12/2010 | Tu | 257/4 |

FOREIGN PATENT DOCUMENTS

| | | |
|---|---|---|
| TW | I236730 | 7/2005 |
| TW | 200847398 | 12/2008 |

OTHER PUBLICATIONS

"Office Action of Taiwan Counterpart Application", issued on Oct. 25, 2012, p. 1-p. 6.

* cited by examiner

*Primary Examiner* — Vongsavanh Sengdara
(74) *Attorney, Agent, or Firm* — J.C. Patents

(57) ABSTRACT

A phase change memory (PCM) is provided which includes a substrate, a plurality of bottom electrodes, a plurality of top electrodes, a plurality of phase change materials, and a plurality of thermal disturbance-preventing parts. The bottom electrodes are disposed in the substrate, and the top electrodes are disposed on the substrate. The phase change (PC) materials are disposed between the top and bottom electrodes, and each of the PC materials is conducted with one of the top electrodes and one of the bottom electrodes. The thermal disturbance-preventing parts are utilized to reduce the effect of thermal disturbance upon the PCM.

8 Claims, 8 Drawing Sheets

PHASE CHANGE MEMORY

BACKGROUND OF THE INVENTION

1. Field of the Invention

The present invention relates to a phase change memory (PCM) capable of solving a thermal disturbance issue.

2. Description of Related Art

A special problem of a conventional PCM is a thermal disturbance issue resulted with a reduction in node sizes. In short, in a PCM 100 illustrated in FIG. 1, when a pitch between any two adjacent bottom electrodes 102a~c becomes smaller, a thermal conductance is usually generated as shown with dashed lines in FIG. 1. That is, originally, only a portion of a phase change (PC) material 106 contacted with the bottom electrode 102b under a top electrode 104 is changed phase. However, portions of the PC material 106 that are contacted with the bottom electrodes 102a and 102c are also changed phases due to the thermal conductance.

Phase change based memory materials have been widely used in read-write optical disks at present. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

SUMMARY OF THE INVENTION

The present invention is directed to a phase change memory (PCM) which has a structure for preventing a thermal disturbance issue, thereby reducing an effect of the thermal disturbance upon the PCM.

The present invention is directed to a PCM including a substrate, a plurality of bottom electrodes, a plurality of top electrodes, a plurality of phase change (PC) materials, and a plurality of thermal disturbance-preventing parts. The top electrodes are disposed on the substrate in parallel along a direction. The bottom electrodes are disposed in the substrate under the top electrodes. The PC materials are disposed between the top and bottom electrodes in parallel along the direction. Each of the PC materials is conducted with one of the top electrodes and the bottom electrodes thereunder. The thermal disturbance-preventing parts are disposed between the bottom electrodes under the top electrodes.

The present invention is further directed to a PCM including a substrate, a plurality of bottom electrodes, a plurality of top electrodes, a plurality of PC materials, and a plurality of means for preventing thermal disturbance. The bottom electrodes are disposed in the substrate. The top electrodes are disposed on the substrate. The PC materials are disposed between the top and bottom electrodes. Moreover, the PC materials are respectively conducted to one of the bottom electrodes and one of the top electrodes. The means for preventing thermal disturbance is utilized to reduce an effect of the thermal disturbance upon the PCM.

In light of the foregoing, in the present invention, a structure for preventing thermal disturbance is designed in the PCM to reduce the effect of the thermal disturbance upon the PCM. Such a structure is accomplished in a manner of heat insulation or heat dissipation. The structural design of the present invention meets a development in miniaturizing device sizes.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
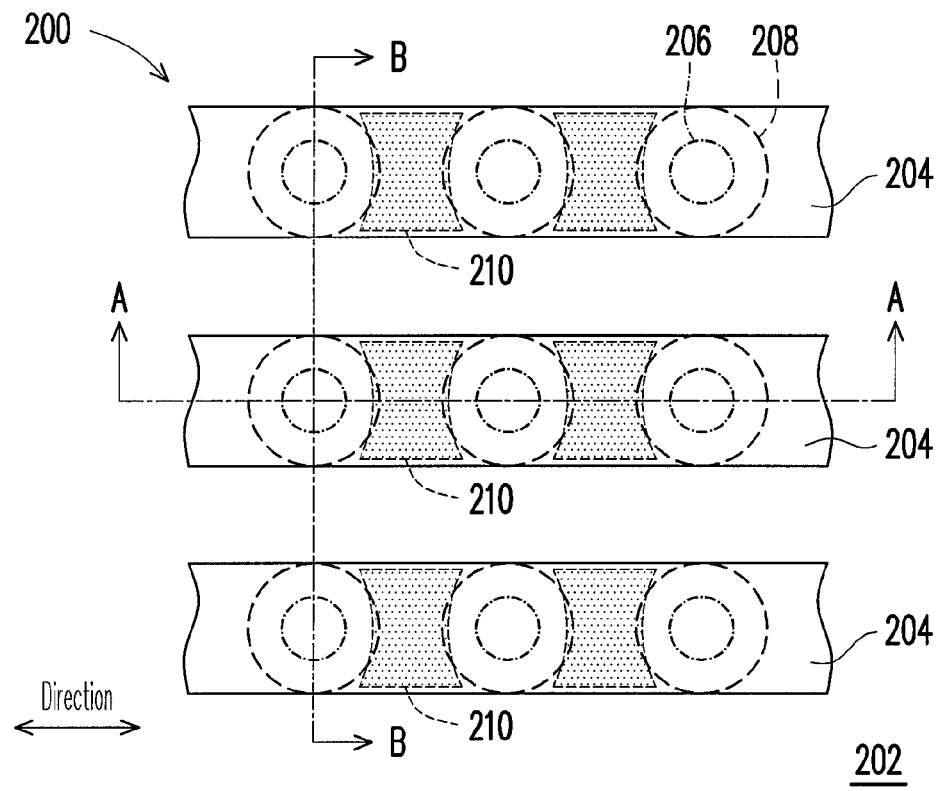
FIG. 2 is a top view of a PCM according to a first embodiment of the present invention.

FIG. 2 is a top view of a phase change memory (PCM) according to a first embodiment of the present invention.

Referring to FIG. 2, a PCM 200 of the present embodiment includes a substrate 202, a plurality of top electrodes 204 disposed on the substrate 202 in parallel along a direction, a plurality of bottom electrodes 206 disposed in the substrate 202 under the top electrodes 204, a plurality of phase change (PC) materials 208 disposed between the top electrodes 204 and the bottom electrodes 206 in parallel along the direction, and a plurality of thermal disturbance-preventing parts 210. The bottom electrodes 206 have a cylindrical shape, and the top electrodes 204 are bit lines, for example. Each of the PC materials 208 is conducted with one of the top electrodes 204 and the bottom electrodes 206 thereunder. The thermal disturbance-preventing parts 210 in the PCM 200 are disposed between the bottom electrodes 206 under the top electrodes 204. In addition, the thermal disturbance-preventing parts 210 have various types as shown in the following figures.

Figure 1:
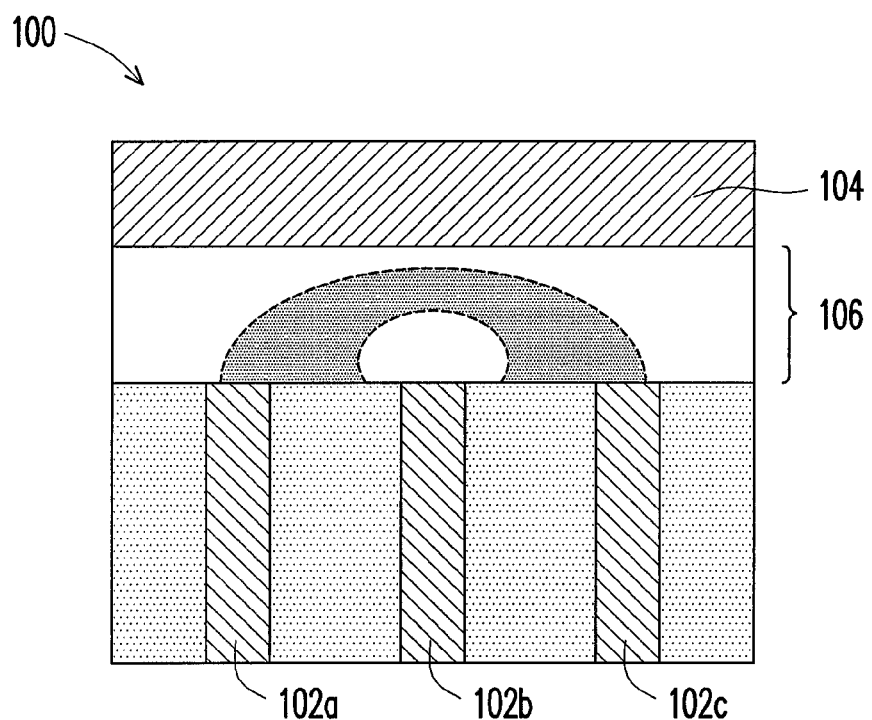
FIG. 1 is a schematic cross-sectional view of a conventional phase change memory (PCM).
Figure 3:
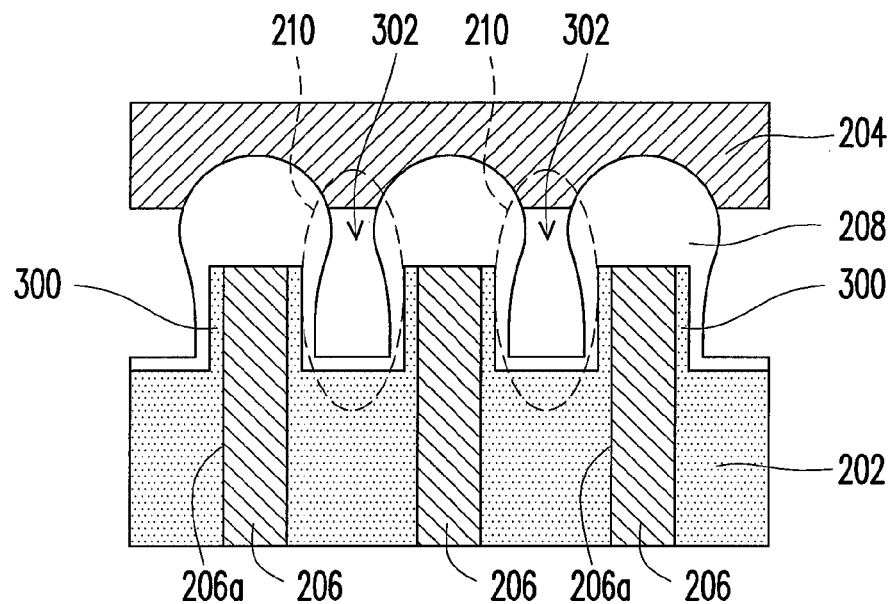
FIGS. 3 and 4 are respectively cross-sectional views of two PCMs taken along line A-A in FIG. 2.
Figure 4:
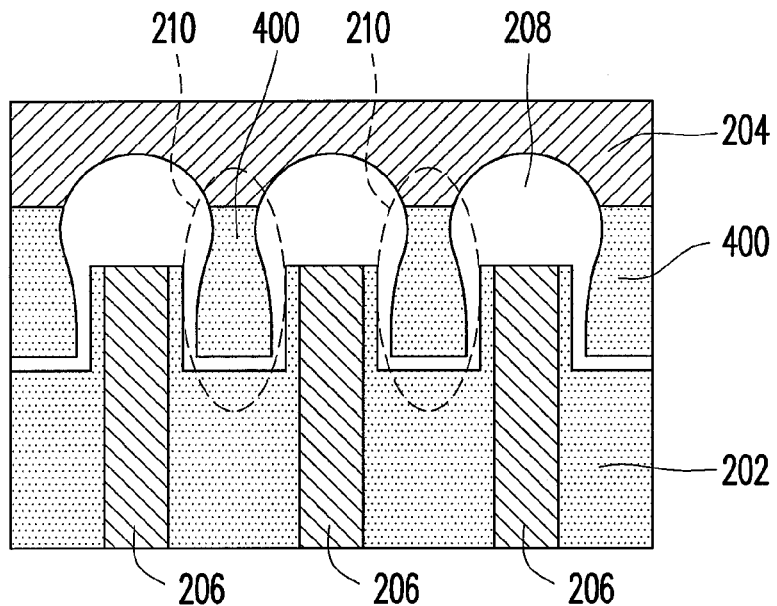

FIGS. 3 and 4 are respectively cross-sectional views of two PCMs taken along line A-A in FIG. 2. In FIGS. 3 and 4, the substrate 202 includes a plurality of protrusions 300 around sidewalls 206a of the bottom electrodes 206. Alternatively, as shown in FIG. 1, the substrate 202 does not include protrusions. In the first embodiment, the PC materials 208 are formed above the bottom electrodes 206 through a physical vapor deposition (PVD) and have a shape similar to a hat. Hence, air gaps 302 or vacuum regions are formed between the bottom electrodes 206 under the top electrode 204 as the thermal disturbance-preventing parts 210. Furthermore, as illustrated in FIG. 4, a low dielectric constant material 400 is filled between the bottom electrodes 206 as the thermal disturbance-preventing parts 210.

Figure 5:
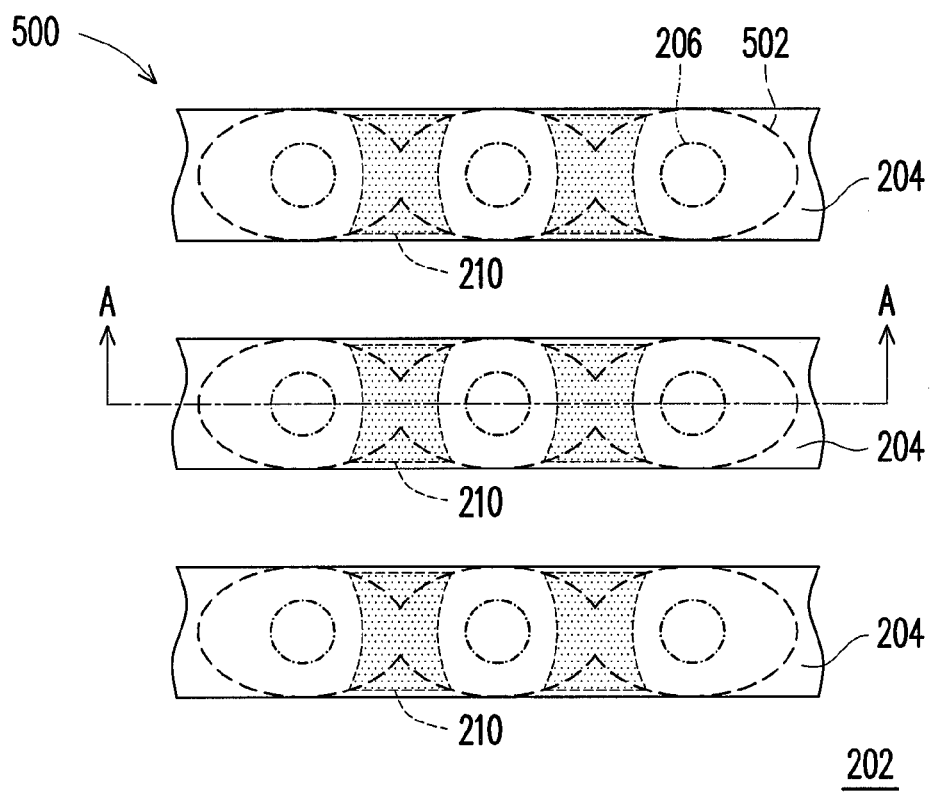
FIG. 5 is a top view of another variation of the PCM in FIG. 2.
Figure 6:
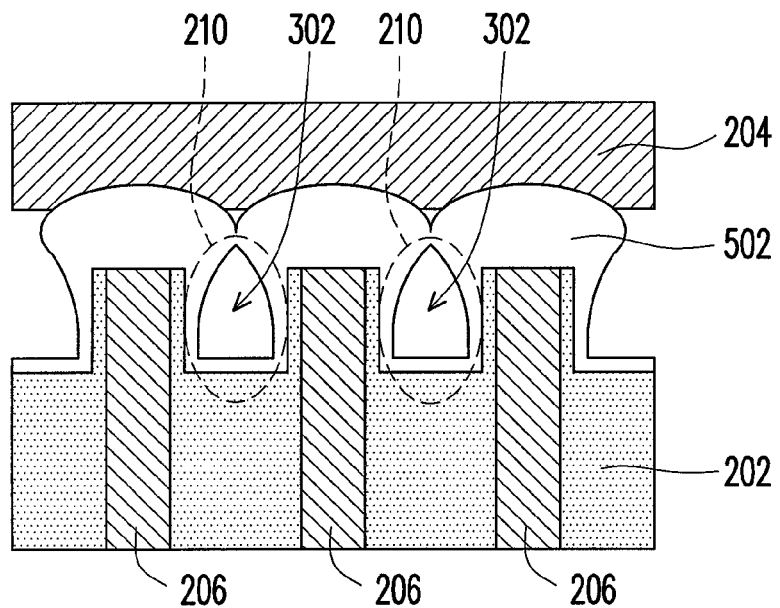
FIG. 6 is a cross-sectional view taken along line A-A in FIG. 5.

FIG. 5 is a top view of another variation of the PCM in FIG. 2. FIG. 6 is a cross-sectional view taken along line A-A in FIG. 5. It should be noted that the same reference numerals as in the first embodiment are used in FIGS. 5 and 6 to represent the same components.

Referring to FIG. 5 and FIG. 6, a PCM 500 also has the substrate 202, the top electrodes 204, the bottom electrodes 206, and the thermal disturbance-preventing parts 210 as those in FIG. 2. However, through controlling process parameters, PC materials 502 are formed into a structure with connected top portions. Moreover, the air gaps 302 and the vacuum regions are formed as the thermal disturbance-preventing parts 210.

Figure 7:
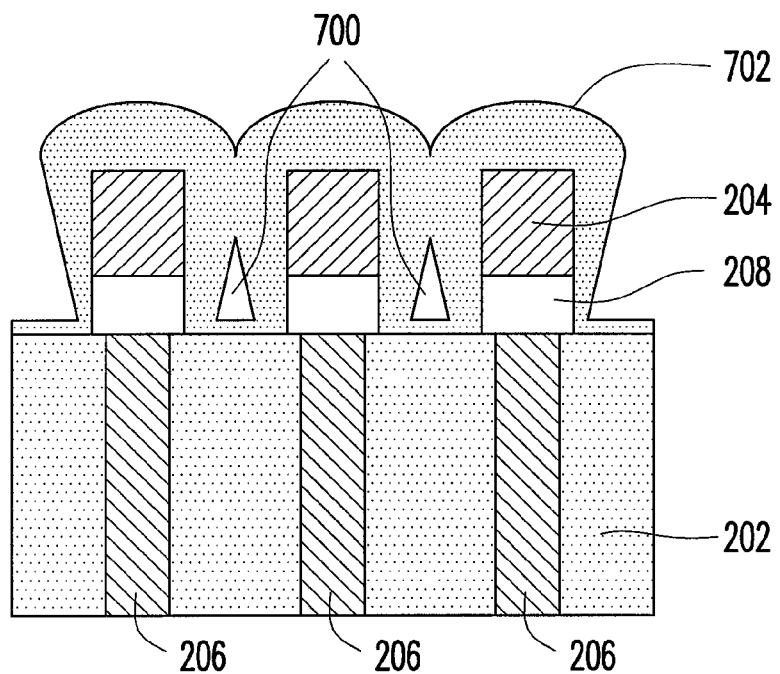
FIG. 7 is a cross-sectional view taken along line B-B in FIG. 2.

Furthermore, in the PCM of the first embodiment, a plurality of air gaps 700 is disposed between the PC materials 208 in parallel along the direction of the top electrodes 204 as illustrated in FIG. 7. FIG. 7 is a cross-sectional view taken along line B-B in FIG. 2. A formation of the air gaps 700 is controlled, for example, through deposition process parameters. Namely, a dielectric layer 702 is formed on the entire substrate 202 to cover the top electrodes 204 and the PC materials 208, so that the air gaps 700 are formed in the dielectric layer 702.

The thermal disturbance-preventing parts 210 in FIGS. 2 through 7 are regarded as a type of heat insulating parts with a function of blocking thermal conductance for preventing the thermal disturbance of the PCM.

Figure 8:
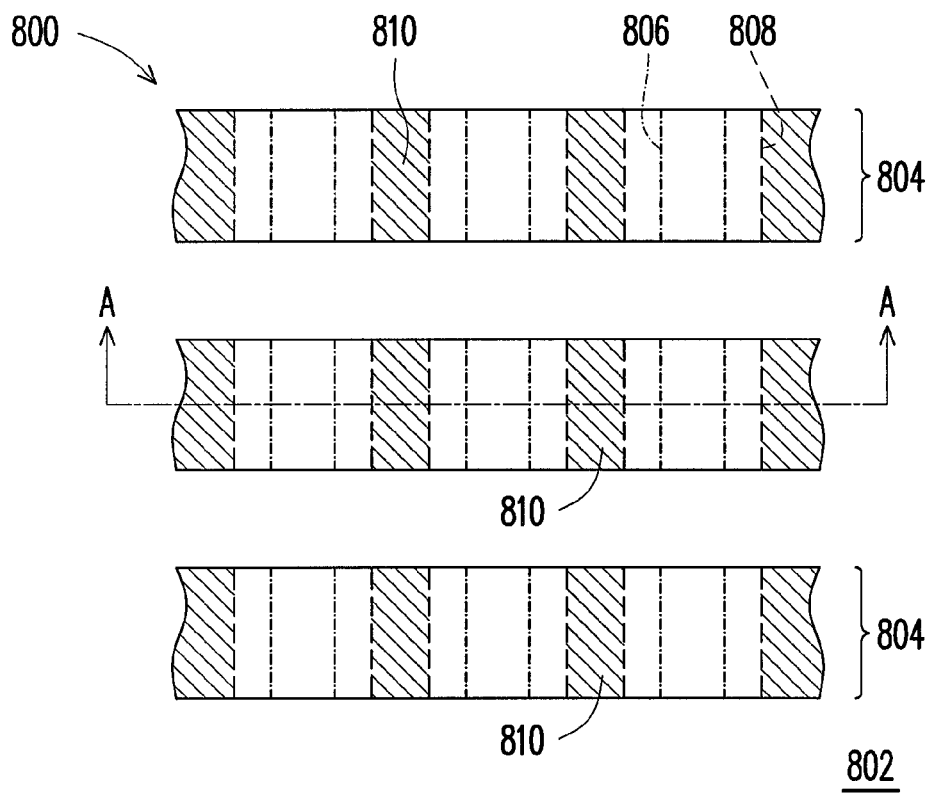
FIG. 8 is a top view of a PCM according to a second embodiment of the present invention.
Figure 9:
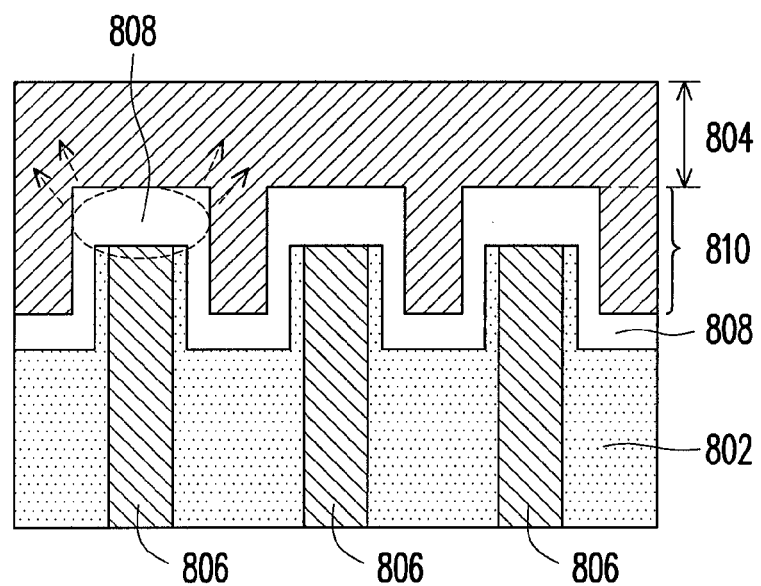
FIG. 9 is a cross-sectional view taken along line A-A in FIG. 8.

FIG. 8 is a top view of a PCM according to a second embodiment of the present invention. FIG. 9 is a cross-sectional view taken along line A-A in FIG. 8.

Referring to FIG. 8 and FIG. 9, a PCM 800 of the present embodiment includes a substrate 802, a plurality of top electrodes 804 disposed on the substrate 802, a plurality of bottom electrodes 806 disposed in the substrate 802 under the top electrodes 804, a plurality of PC materials 808 disposed between the top electrodes 804 and the bottom electrodes 806, and a plurality of thermal disturbance-preventing parts 810. The bottom electrodes 806 in FIG. 8 have a sheet form. The thermal disturbance parts 810 are connected with the top electrodes 806 and preferably form a heat dissipating material layer integrally with the top electrodes 806. The thermal disturbance-preventing parts 810 in FIG. 9 are disposed between the PC materials 808 under the top electrodes 804. When the heat (i.e. the dashed portion in FIG. 9) is generated in the PC materials 808 on the left, the heat is rapidly dissipated from the PC materials 808 to the thermal disturbance-preventing parts 810 on the sides and the top electrodes 804.

Figure 10:
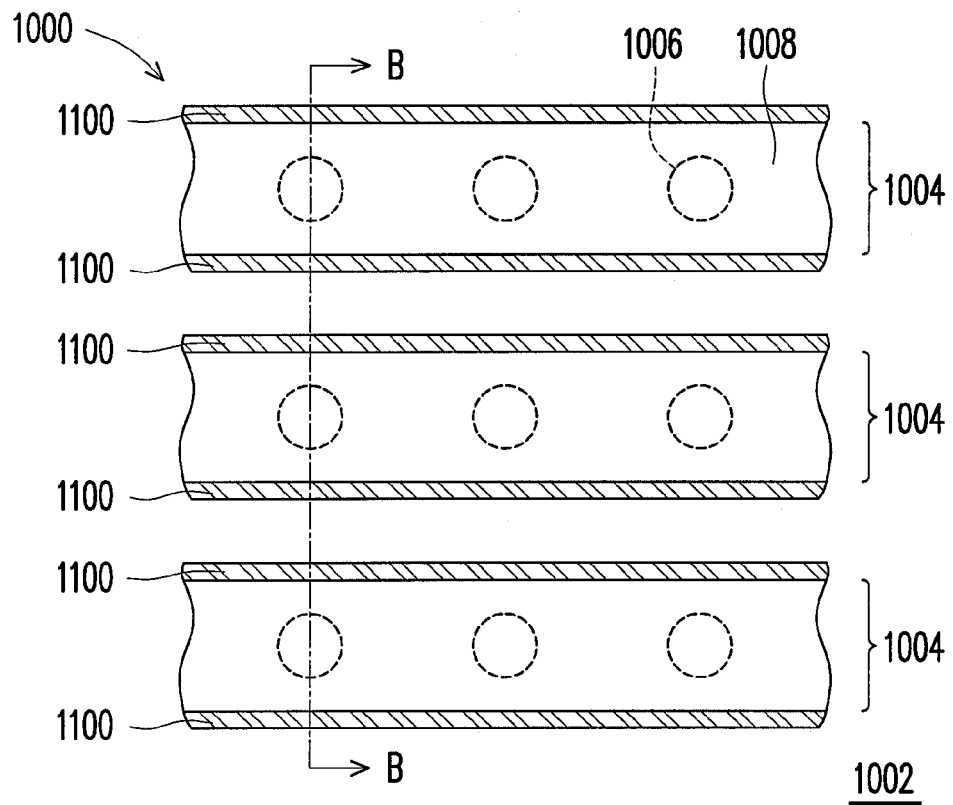
FIG. 10 is a top view of a PCM according to a third embodiment of the present invention.
Figure 11:
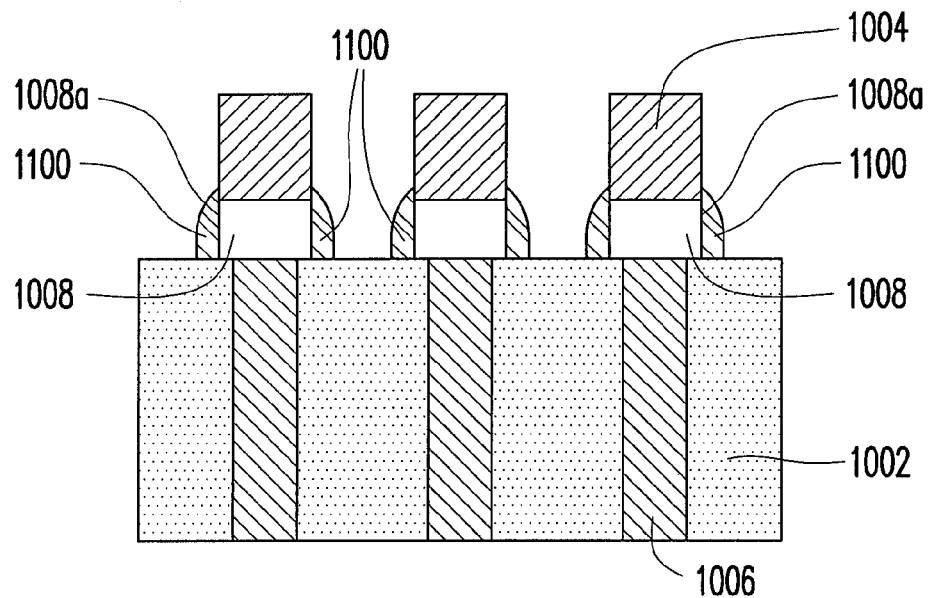
FIG. 11 is a cross-sectional view taken along line B-B in FIG. 10.

FIG. 10 is a top view of a PCM according to a third embodiment of the present invention. FIG. 11 is a cross-sectional view taken along line B-B in FIG. 10.

Referring to FIG. 10 and FIG. 11 simultaneously, a PCM 1000 of the present embodiment includes a substrate 1002, a plurality of top electrodes 1004 disposed on the substrate 1002, a plurality of bottom electrodes 1006 disposed in the substrate 1002 under the top electrodes 1004, a plurality of PC materials 1008 disposed between the top electrodes 1004 and the bottom electrodes 1006, and a plurality of metal spacers 1010. In FIG. 10, since the PC materials 1008 are flatly placed on the substrate 1002 and not showing unevenness, an area covered by the PC materials 1008 are basically the same as an area covered by the top electrodes 1004. The metal spacers 1100 are disposed on side walls 1008a of each PC material 1008 for preventing thermal disturbance. Moreover, the metal spacers 1100 of the third embodiment and the thermal disturbance-preventing parts (such as thermal disturbance-preventing parts 810 in FIG. 9) of the second embodiment can be used in combination for enhancing the heat dissipation effect.

Figure 12:
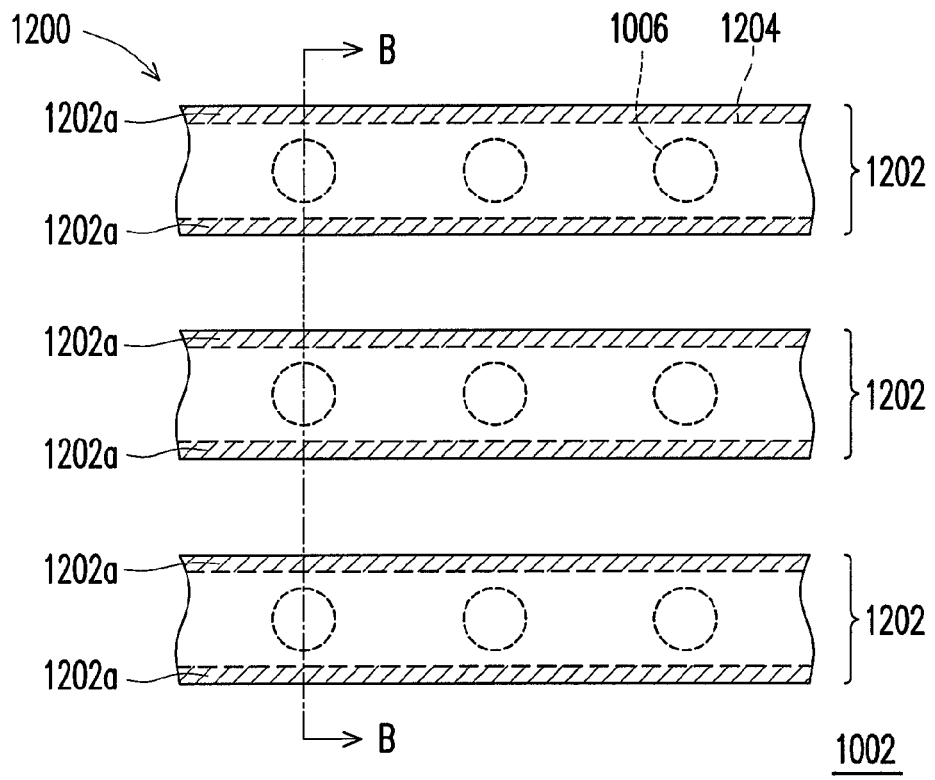
FIG. 12 is a top view of another variation of the PCM in FIG. 10.
Figure 13:
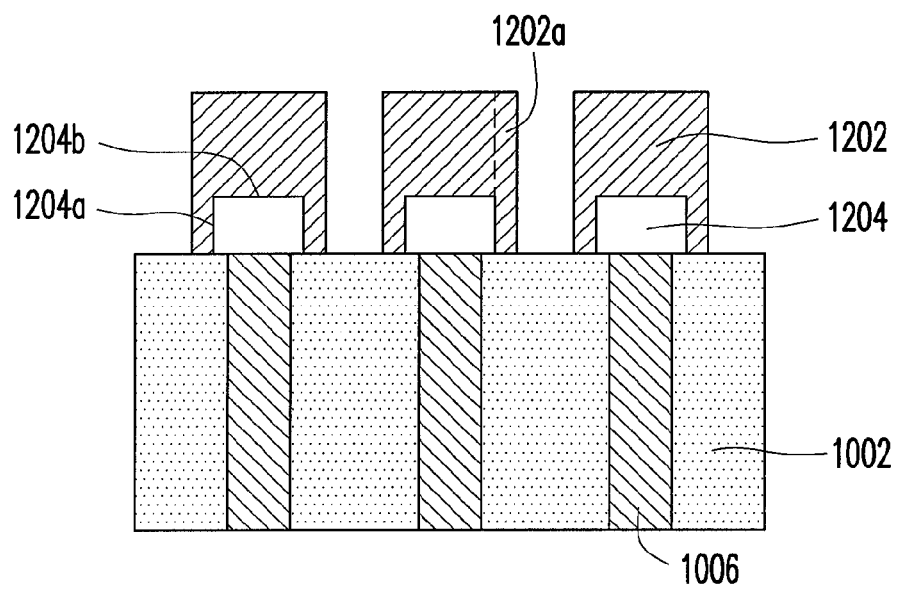
FIG. 13 is a cross-sectional view taken along line B-B in FIG. 12.

FIG. 12 is a top view of another variation of the PCM in FIG. 10. FIG. 13 is a cross-sectional view taken along line B-B in FIG. 12. It should be noted that the same reference numerals as in the third embodiment are used in FIGS. 12 and 13 to represent the same components.

Referring to FIGS. 12 and 13, a difference between a PCM 1200 in FIG. 12 and the PCM 1000 in FIG. 10 is that top electrodes 1202 in FIG. 12 cover sidewalls 1204a and top surfaces 1204b of PC materials 1204 entirely, thus the heat dissipation effect is achieved without the metal spacers 1010 in FIG. 10. In other words, portions 1202a of the top electrodes 1202 disposed on the sidewalls 1204a act as the thermal disturbance-preventing parts of the PCM 1200.

The thermal disturbance-preventing parts in FIGS. 8 through 13 are regarded as a type of heat dissipating parts with a function of bringing the heat away rapidly for preventing the thermal disturbance of the PCM.

Figure 14:
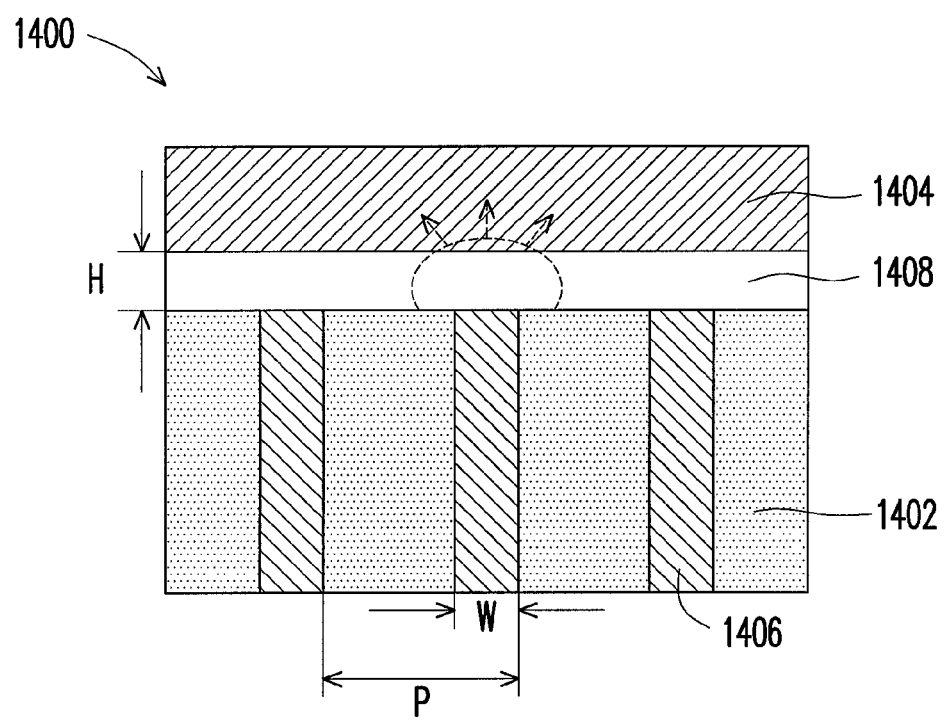
FIG. 14 is a top view of a PCM according to a fourth embodiment of the present invention.

FIG. 14 is a top view of a PCM according to a fourth embodiment of the present invention.

Traditionally, the PC materials are manufactured with thick films which block the dissipation of heat. Hence, in the present invention, the thickness of the PC materials is controlled for the purpose of enhancing heat dissipation. Referring to FIG. 14, a PCM 1400 of the present embodiment includes a substrate 1402, a plurality of top electrodes 1404 disposed on the substrate 1402, a plurality of bottom electrodes 1406 disposed in the substrate 1402 under the top electrodes 1404, a plurality of PC materials 1408 disposed between the top electrodes 1404 and the bottom electrodes 1406. The bottom electrodes 1406 have a cylindrical shape or sheet form. Moreover, a cross-section of each bottom electrode 1406 along an extending direction of the top electrodes 1404 is deemed as a width W, and the bottom electrodes 1406 each has a pitch P therebetween. The PC materials 1408 have a thickness H. If the thickness H is smaller than 1.5 times of the width W and smaller than 0.5 times of the pitch P, then when the heat (the dashed portion in FIG. 14) is generated in the PC materials 1408 at the center, the heat is rapidly dissipated from the PC materials 1408 to the top electrodes 1404 above.

The concept of the fourth embodiment can be applied in combination with the thermal disturbance-preventing parts in all the embodiments aforementioned for enhancing the heat dissipation effect.

In summary, in the present invention, a means for preventing thermal disturbance is added into the PCM, so that the thermal disturbance issue is prevented and the effect of the thermal disturbance upon the PCM is reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A phase change memory (PCM), comprising:
    a substrate having a plurality of protrusions;
    a plurality of top electrodes disposed on the substrate in parallel along a direction;
    a plurality of bottom electrodes respectively disposed in each of the protrusions of the substrate and under the plurality of top electrodes;
    a plurality of phase change (PC) elements, disposed between the plurality of top electrodes and the plurality of bottom electrodes in parallel along the direction, and each of the plurality of PC elements conducted with a subset of the plurality of bottom electrodes arranged along the direction and one of the plurality of top electrodes; and
    a plurality of thermal disturbance-preventing parts, disposed between the plurality of bottom electrodes and under the plurality of top electrodes, wherein the plurality of thermal disturbance-preventing parts are in direct contact with the plurality of top electrodes and wherein each of the plurality of PC elements has a first thickness on the protrusion and a second thickness under the thermal disturbance-preventing part, and the first thickness is greater than the second thickness.

2. The PCM as claimed in claim 1, wherein the plurality of thermal disturbance-preventing parts comprises air gaps, vacuum regions, or low dielectric constant materials.

3. The PCM as claimed in claim 1, wherein the plurality of thermal disturbance-preventing parts comprises a heat dissipating material layer formed integrally with the plurality of top electrodes.

4. The PCM as claimed in claim 1, further comprising a plurality of metal spacers disposed on a sidewall of each of the plurality of PC elements.

5. The PCM as claimed in claim 1, further comprising a plurality of air gaps disposed between the plurality of PC elements in parallel along the direction.

6. The PCM as claimed in claim 1, wherein the plurality of bottom electrodes has a cylindrical shape or a sheet form.

7. The PCM as claimed in claim 1, wherein: a cross-section of each of the plurality of bottom electrodes along the direction has a width, and each of the plurality of bottom electrodes along the direction comprises a pitch; and each of the plurality of PC elements has a thickness, and the thickness is smaller than 1.5 times of the width and smaller than 0.5 times of the pitch.

8. The PCM as claimed in claim 1, wherein the plurality of top electrodes is a bit line.

* * * * *